United States Patent
Takahashi et al.

(10) Patent No.: US 11,434,565 B2
(45) Date of Patent: Sep. 6, 2022

(54) CLEANING METHOD OF SEMICONDUCTOR MANUFACTURING DEVICE

(71) Applicant: KANTO DENKA KOGYO CO., LTD., Tokyo (JP)

(72) Inventors: Yoshinao Takahashi, Tokyo (JP); Korehito Kato, Shibukawa (JP)

(73) Assignee: KANTO DENKA KOGYO CO., LTD., Tokyo (JP)

( * ) Notice: Subject to any disclaimer, the term of this patent is extended or adjusted under 35 U.S.C. 154(b) by 82 days.

(21) Appl. No.: 16/091,202

(22) PCT Filed: Mar. 29, 2017

(86) PCT No.: PCT/JP2017/012976
§ 371 (c)(1),
(2) Date: Oct. 4, 2018

(87) PCT Pub. No.: WO2017/175643
PCT Pub. Date: Oct. 12, 2017

(65) Prior Publication Data
US 2019/0112705 A1    Apr. 18, 2019

(30) Foreign Application Priority Data

Apr. 5, 2016    (JP) .............................. JP2016-075877

(51) Int. Cl.
*C23C 16/44*    (2006.01)
*H01L 21/205*    (2006.01)
(Continued)

(52) U.S. Cl.
CPC .......... *C23C 16/4405* (2013.01); *C23C 16/44* (2013.01); *H01L 21/02041* (2013.01); *H01L 21/205* (2013.01); *H01L 21/31* (2013.01)

(58) Field of Classification Search
CPC ..... C23C 16/4405; C23C 16/44; H01L 21/31; H01L 21/02041; H01L 21/205;
(Continued)

(56) References Cited

U.S. PATENT DOCUMENTS 5,616,208 A * 4/1997 Lee ................... H01L 21/67766
156/345.24
5,858,881 A    1/1999 Habuka
(Continued)

FOREIGN PATENT DOCUMENTS

JP    H04-181734 A    6/1992
JP    H10-81950 A     3/1998
(Continued)

OTHER PUBLICATIONS

English Translation of JPH04181734 to Mori et al., accessed on Feb. 2020. (Year: 1992).*
(Continued)

*Primary Examiner* — Eric W Golightly
*Assistant Examiner* — Arlyn I Rivera-Cordero
(74) *Attorney, Agent, or Firm* — Browdy and Neimark, PLLC

(57) ABSTRACT

This invention provides a cleaning method that uses a cleaning gas composition for a semiconductor manufacturing device, including a monofluorohalogen compound represented by XF (in which X is Cl, Br or I) as the main component, and provides a method for removing unwanted film, such as a Si-containing deposit, attached to the interior of the processing room or processing vessel after a processing operation without damaging the interior of the processing room or processing vessel using such monofluorohalogen compound.

6 Claims, 1 Drawing Sheet

(51) Int. Cl.
*H01L 21/31* (2006.01)
*H01L 21/02* (2006.01)

(58) Field of Classification Search
CPC ......... H01L 21/02046; H01L 21/02269; H01L 21/324; H01L 21/67034; H01L 21/67248
See application file for complete search history.

(56) References Cited

U.S. PATENT DOCUMENTS

| | | |
|---|---|---|
| 6,147,006 A | 11/2000 | Mouri et al. |
| 2002/0086501 A1 | 7/2002 | O'Donnell et al. |
| 2004/0077162 A1 | 4/2004 | Leeson et al. |
| 2016/0303620 A1 | 10/2016 | Kim et al. |

FOREIGN PATENT DOCUMENTS

| | | |
|---|---|---|
| JP | 2001-267241 A | 9/2001 |
| JP | 2004-153265 A | 5/2004 |
| JP | 2007-141895 A | 6/2007 |
| JP | 2011-96937 A | 5/2011 |
| JP | 2011-208193 A | 10/2011 |
| TW | 577916 B | 3/2004 |
| TW | I267563 B | 12/2006 |

OTHER PUBLICATIONS

Extended European Search Report of EP17779022.7 dated Oct. 22, 2019 6 pages.
International Search Report of PCT/JP2017/012976, dated Jun. 6, 2017; 8 pages.

\* cited by examiner

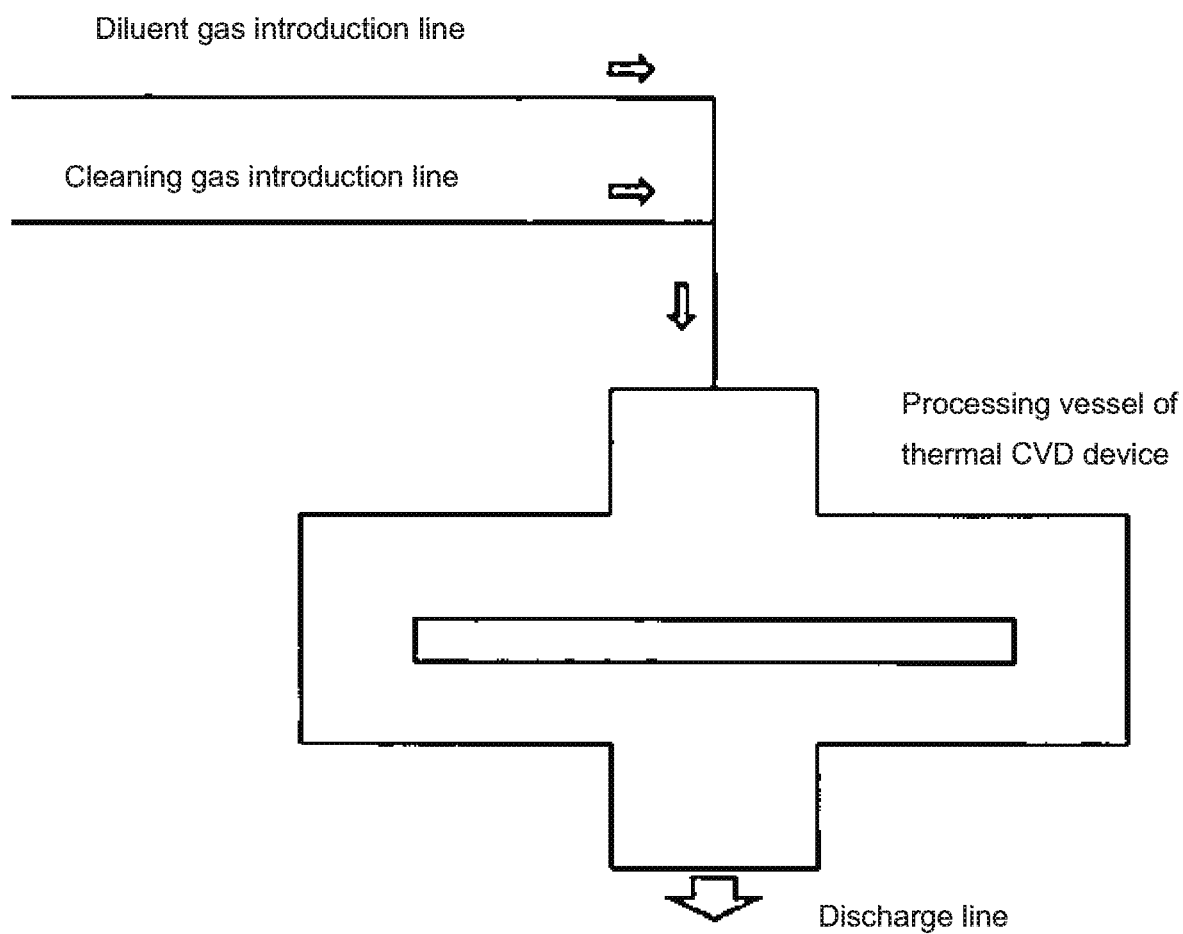

CLEANING METHOD OF SEMICONDUCTOR MANUFACTURING DEVICE

TECHNICAL FIELD

The present invention relates to a cleaning method, specifically a cleaning method for removing unwanted silicon compounds that are deposited inside the processing room or processing vessel of a semiconductor manufacturing device.

BACKGROUND ART

A manufacturing process of a semiconductor device includes a step of forming the desired thin film on a substrate by plasma enhanced chemical vapor deposition (plasma CVD), thermal chemical vapor deposition (thermal CVD), sputtering, or ion-plating. These film deposition processes produces deposit attaching to areas other than the substrate targeted for film deposition, such as the inner walls of the film deposition device, due to the device structure and properties of chemical reaction used in film deposition. For example, since thermal CVD is a film deposition process in which a desired thin film is formed on a substrate by thermal decomposition of the starting material gas and promotion of chemical reaction by thermal energy, unwanted deposit develops inside the processing room or processing vessel of the thermal CVD-based film deposition device due to adsorption of the thermally decomposed products or progress of chemical reaction in heated sections other than the substrate. Such deposit grows with repeated film deposition operations, and peels off when a certain size is reached. The deposit that peeled off may attach to the substrate of the semiconductor device being manufactured, and thus reduce the yield, so the interior of the processing room or the processing vessel of the semiconductor manufacturing device needs to be cleaned regularly to remove unwanted deposit.

Cleaning methods of unwanted deposit on the interior of the semiconductor film deposition device includes (1) a method of opening the semiconductor manufacturing device and wiping off the deposit using chemical agents, or (2) a dry-cleaning method which introduces a highly reactive gas, such as $F_2$ or $ClF_3$, into the film deposition device to induce a reaction with the deposit, and to discharge the result as a highly volatile substance out of the processing room or processing vessel. Since the method of (1) requires operation time and holds the risk of contaminating the interior of the device by opening it up, the dry-cleaning method of (2) using a highly reactive gas is commonly used.

For example, Patent Document 1 discloses with regards to nitrides such as a silicon nitride film being formed on a surface of a quartz discharge tube in a vacuum processing device, a method for selectively removing nitrides from the quartz undercoat using chlorine fluoride generated from plasmatized nitrogen trifluoride and chlorine gas.

In this prior invention is used a monofluorohalogen compound, ClF, similar to the present invention, but the prior invention does not disclose specific conditions that are essential for efficient production of ClF, such as the ratio of gas flow rate, pressure, and temperature inside the discharge tube. The ratio of gas flow rate of the starting material and the reaction temperature were studied in the present invention to achieve efficient production of ClF, and thereby enable a more effective removal of deposit using ClF.

Patent Document 2 discloses a stationary or flow-based method of introducing at least one type of highly concentrated (i.e. 50 to 100 percent by volume) gas of chlorine monofluoride, chlorine trifluoride and chlorine pentafluoride into the thin film forming device, in which metal or compounds thereof are deposited, to induce reaction with the deposited metal or compounds thereof at a low temperature below 400° C., and removing the deposit at a high speed without damaging the device surface through erosion.

In this prior invention is disclosed a monofluorohalogen compound, ClF, similar to the present invention, but when the interior of the processing room or processing vessel of the film deposition device was cleaned using ClF in the present invention, the reactivity with the deposit in the thin film deposition device (metals such as W, Si, V, Nb, Ta, Se, Te, Mo, Re, Os, Ir, Sb, Ge and compounds thereof), which was the subject of the prior invention, was low at a temperature disclosed in the prior invention of below 400° C., and it was shown that the cleaning speed was lower than when $ClF_3$ was used. Further, based on the study by the inventors of the present invention, $ClF_3$ induces corrosion of the processing room or processing vessel at 400° C. or higher, but no corrosion occurs in the interior of the processing room or processing vessel when a monofluorohalogen compound, ClF, is used, so that the device is cleaned without being damaged.

Patent Document 3 discloses a method of supplying to a decompressible processing room for film deposition/crystalline growth, a sole interhalogen compound gas, a mixed interhalogen compound gas comprising two or more interhalogen compound gases, a mixed gas of the sole interhalogen compound gas and an inert gas against such sole gas, or a mixed gas of the mixed interhalogen compound gas and an inert gas against such interhalogen compound gas, in which the interhalogen compound gas is selected from a group consisting of chloric fluoride, chloric trifluoride, chloric pentafluoride, bromic trifluoride, bromic pentafluoride, bromic monochloride, iodic pentafluoride and iodic heptafluoride, and processing the interior of the inductive tube at 0.5 kPa to 80 kPa, to thereby clean a deposit film. The deposit film consists of a powder formed by chipping amorphous silicon or microcrystal silicon, of a silicon compound that constitutes a film deposition material or a crystal growth material (including amorphous silicon, silicon nitride, silicon oxide, silicon oxinitride), and of a dopant (including molybdenum, tantalum, tungsten, arsenic, boron, phosphorus, germanium, antimony).

In this prior invention is disclosed a monofluorohalogen compound, ClF, similar to the present invention, but there is no disclosure of heating the device to be cleaned or of the temperature of cleaning. Interhalogen gas other than chloric fluoride, such as chloric trifluoride, chloric pentafluoride, bromic trifluoride, bromic pentafluoride, bromic monochloride, iodic pentafluoride and iodic heptafluoride, promotes excessive reaction in the cleaning operation depending on the temperature of the device and the rate of the gas mixture, thereby damaging the device. It is known that when using $ClF_3$ in the present invention, the interior of the device becomes corroded at a temperature of 400° C. or higher, thus damaging the device, and a use of ClF allows cleaning to be carried out with good controllability and without corroding the device even at a temperature of 400° C. or higher.

CITATION LIST

Patent Documents

[Patent Document 1] JP 2011-96937 A
[Patent Document 2] JP H10-81950 A
[Patent Document 3] JP 2011-208193 A

SUMMARY OF INVENTION

Problem to be Solved by the Invention

In conventional plasma-less cleaning methods and cleaning methods disclosed in Patent Document 2 and Patent Document 3, it was recommended to use highly reactive interhalogen compounds, such as $ClF_3$ or $BrF_3$, $IF_7$, or FNO, $F_2$, with the purpose of shortening the cleaning time, completing deposit removal and lowering the reaction temperature. Using a highly reactive gas for cleaning allows a high speed cleaning to be performed on a silicon-containing film even at a relatively low temperature.

However, due to their high reactivity, the highly reactive compounds react not just with the deposit, which is the subject to be cleaned, but with members on the interior of the processing room or processing vessel of the semiconductor manufacturing device, and damages those members by corroding or deforming the members. Such corrosion decreases the yield of the production of the semiconductor device as a particle, and greatly influences the life of the semiconductor manufacturing device. Such damage is reduced or prevented by dilution using inert gas, cleaning, or lowering of temperature, but these measures result in the cleaning time being extended and the deposit remaining. As can be seen, it is difficult to control a cleaning of a semiconductor manufacturing device by a highly reactive compound.

The present invention sets out to resolve the aforementioned problem in the conventional cleaning method of the interior of a processing room or processing vessel of a semiconductor manufacturing device, and provides a highly controllable cleaning method to remove a film composed mainly of unwanted silicon without damaging the interior of the vessel, by using plasma-less cleaning, the unwanted silicon being deposited or attached to the interior of the processing room or processing vessel.

Solution to Problem

The present inventors conducted extensive study to achieve the above object and found that a cleaning gas composition comprising a halogen fluoride compound (the halogen being a halogen other than fluorine atom) as the main active component, the halogen fluoride compound having one fluorine atom in the molecule, such as ClF, BrF, and IF, is effective for removing a film consisting mainly of unwanted silicon, deposited or attached to the interior of the processing room or processing vessel of the semiconductor manufacturing device, with high controllability and without damaging the interior of the vessel, and thus completed the present invention.

The following embodiments are provided by the present invention.

[1]
A cleaning method that includes a process of removing a Si-containing deposit attached to an interior of a processing room or processing vessel after performing a processing operation in the interior of the processing room or processing vessel used for manufacturing a semiconductor device, the method comprising: supplying, in that process of removing a Si-containing deposit, monofluorohalogen gas represented by XF (wherein X is Cl, Br or I) into the processing room or processing vessel to remove the Si-containing deposit, wherein a temperature in the processing room or processing vessel is 400° C. or higher when monofluorohalogen gas is supplied into the processing room or processing vessel.

[2]
The method according to [1], wherein the temperature in the processing room or processing vessel is 400° C. or higher and lower than 2000° C.

[3]
The method according to [1], wherein the temperature in the processing room or processing vessel is 400° C. or higher and 800° C. or lower.

[4]
The method according to any one of [1] to [3], wherein the monofluorohalogen gas includes ClF.

[5]
The method according to any one of [1] to [4], wherein the Si-containing deposit includes at least one of silicon dioxide ($SiO_2$), silicon nitride (SiN), silicon carbide (SiC), polycrystalline silicon (Poly-Si), single crystal silicon, amorphous silicon (a-Si), silicon oxynitride (SiON), silicon carbonitride (SiCN), silicon oxycarbonitride (SiOCN).

The "processing room or processing vessel of a semiconductor manufacturing device" used herein is a section or member possessing a surface that a Si-containing deposit may attach to, the section or member being implemented in the semiconductor manufacturing device, and the shape is not particularly limited.

Advantageous Effects of Invention

The present invention solves the problem of conventional cleaning gas composition and cleaning method, and provides a cleaning method that can remove, without using plasma, a film consisting mainly of unwanted silicon deposited or attached to the interior of a processing room or processing vessel, with good controllability and without damaging the interior of the processing room or processing vessel of the semiconductor manufacturing device.

The cleaning method of the present invention exerts the following effects.
(1) It can reduce particle generation caused by damage, increase the yield in the manufacture of a semiconductor device, and increase the life of a film deposition device, since it is a cleaning gas composition that does not damage the interior of the processing room or processing vessel of the semiconductor manufacturing device.
(2) It can prevent/reduce damage, because it is a highly controllable cleaning gas composition, and no excessive reaction occurs even when the processing room or processing vessel of the semiconductor manufacturing device has a locally high temperature section.
(3) It can prevent/reduce damage to the interior of the processing room or processing vessel of the semiconductor manufacturing device, because it has high controllability at a high temperature condition (400° C. or higher) so that no excessive reaction occurs.
(4) It can clean the interior of the processing room or processing vessel to a cleansed state by efficiently removing deposit consisting of elements that form fluorides with high vapor pressure by fluorinating Si, C, S, B, P, As, W, Ge, Ta, Ir, Pt, etc.
(5) It can clean the interior of the processing room or processing vessel to a cleansed state by efficiently removing deposit consisting of elements (e.g. Al Ga, Zn, Hf, Zr) that bond with halogen elements and form fluorides having a high vapor pressure, by the effect of X (wherein X is Cl, Br or I) bonding with F.
(6) Generally speaking, the film deposition process by thermal CVD is performed at a high temperature of 400° C. or higher, so it was recommended in conventional devices to lower the temperature of the interior of the processing room or processing vessel from the temperature of the film deposition process to a temperature suited for cleaning in order to prevent/reduce damages to the devices. However, a use of the cleaning gas composition of the present invention allows highly controllable cleaning at a temperature close to the film deposition process, thereby reducing the time for adjusting temperature, and improving productivity.

BRIEF DESCRIPTION OF DRAWINGS

FIG. 1 shows a schematic view of the thermal CVD device used in the Examples.

DESCRIPTION OF EMBODIMENTS

The cleaning gas composition used in the cleaning method of the interior of the processing room or processing vessel of the semiconductor manufacturing device of the present invention includes monofluorohalogen compound represented by XF (wherein X is Cl, Br or I) as the main active component.

The XF (wherein X is Cl, Br or I) used in the cleaning method of the present invention is preferably diluted by inert gas selected from $N_2$, $CO_2$, He, Ar, Ne, Kr, and Xe particularly when highly controllable cleaning is demanded. XF should preferably be diluted to an XF concentration of 10 to 90 vol % against 100 vol % of the total amount of XF and inert gas, and more preferably to 10 to 40 vol %. The role of the inert gas is to regulate excessive reaction by XF, and it effectively improves the controllability of cleaning. The area at which inert gas is added is the stage before introducing XF to the processing room or processing vessel, or in the processing room or processing vessel.

The cleaning method of the present invention is useful when cleaning is performed at a high temperature of 400° C. or higher. The conventional cleaning gas was highly reactive, and damaged the interior of the processing room or processing vessel at a high temperature of 400° C. or higher.

When introducing a cleaning gas composition and performing a cleaning operation of the interior of the processing room or processing vessel of the semiconductor manufacturing device in the cleaning method of the present invention, the interior of the processing room or processing vessel may be heated to 400° C. or higher and lower than 2000° C. to efficiently react the monofluorohalogen compound represented by XF (wherein X is Cl, Br or I) with the unwanted deposit attached to the interior of the processing room or processing vessel, which allows the processing room or processing vessel to be cleaned and solves the aforementioned problem.

The temperature of the interior of the processing room or processing vessel is preferably heated to 400° C. or higher and lower than 1000° C., particularly 400° C. or higher and 800° C. or lower, and particularly 400° C. or higher and 600° C. or lower.

When introducing a cleaning gas composition and performing a cleaning operation of the interior of the processing room or processing vessel of the semiconductor manufacturing device in the cleaning method of the present invention, the interior of the processing room or processing vessel may be adjusted to a pressure in a range of 0.001 to 760 Torr to efficiently react the monofluorohalogen compound represented by XF (wherein X is Cl, Br or I) with the unwanted deposit attached to the interior of the processing room or processing vessel, which allows the processing room or processing vessel to be cleaned. When a cleaning that does not damage the interior of the processing room or processing vessel of a semiconductor manufacturing device, or a highly controllable cleaning, is particularly desired, or when a compound with a relatively low vapor pressure is produced through the cleaning operation, the pressure of the interior of the processing room or processing vessel is preferably adjusted to a range of 0.001 to 300 Torr.

EXAMPLES

The present invention is further described by Examples and Comparative Examples without being limited thereby.

The following examples were performed by using the device shown in FIG. 1.

Example 1

A Si wafer sample composed of a Si substrate being laminated with 100 nm of $SiO_2$, the $SiO_2$ layer being further laminated with 300 nm of polycrystalline silicon (Poly-Si), was placed inside the processing vessel of the heatable vacuum device, and ClF was applied as a monofluorohalogen compound. ClF was fed from the capturing vessel through the mass flow controller into the processing vessel at a flow rate of 100 sccm, and $N_2$ was simultaneously fed as an inert gas to provide dilution at a flow rate of 400 sccm to adjust the ClF concentration to 20 vol %. The wafer sample was processed for 30 sec. by adjusting the device interior to a temperature of 400° C. and a pressure of 100 Torr. As a result, all the Poly-Si film and the $SiO_2$ film were removed (etching rate of Poly-Si was 600 nm/min or higher, and the etching rate of $SiO_2$ was 200 nm/min or higher), and no change was observed in the appearance of the Si substrate, and the weight change rate was −0.09%.

Example 2

A Si wafer sample and processing device similar to Example 1 were used, and ClF was applied as the monofluorohalogen compound. ClF was fed from the capturing vessel through the mass flow controller into the processing vessel at a flow rate of 200 sccm, and $N_2$ was simultaneously fed as an inert gas to provide dilution at a flow rate of 300 sccm to adjust the ClF concentration to 40 vol %. The wafer sample was processed for 30 sec. by adjusting the device interior to a temperature of 400° C. and a pressure of 100 Torr. As a result, all the Poly-Si film and the $SiO_2$ film were removed (etching rate of Poly-Si was 600 nm/min or higher, and the etching rate of $SiO_2$ was 200 nm/min or higher), and no change was observed in the appearance of the Si substrate, and the weight change rate was −0.06%.

Example 3

A Si wafer sample and processing device similar to Example 1 were used, and ClF was applied as the monofluorohalogen compound. ClF was fed from the capturing vessel through the mass flow controller into the processing vessel at a flow rate of 50 sccm, and $N_2$ was simultaneously fed as an inert gas to provide dilution at a flow rate of 450 sccm to adjust the ClF concentration to 10 vol %. The wafer sample was processed for 30 sec. by adjusting the device interior to a temperature of 400° C. and a pressure of 100 Torr. As a result, all the Poly-Si film and the $SiO_2$ film were removed (etching rate of Poly-Si was 600 nm/min or higher, and the etching rate of $SiO_2$ was 200 nm/min or higher), and no change was observed in the appearance of the Si substrate, and the weight change rate was −0.01%.

Example 4

A Si wafer sample and processing device similar to Example 1 were used, and ClF was applied as the monofluorohalogen compound. ClF was fed from the capturing vessel through the mass flow controller into the processing vessel at a flow rate of 400 sccm, and $N_2$ was simultaneously fed as an inert gas to provide dilution at a flow rate of 100 sccm to adjust the ClF concentration to 80 vol %. The wafer sample was processed for 30 sec. by adjusting the device interior to a temperature of 400° C. and a pressure of 100 Torr. As a result, all the Poly-Si film and the $SiO_2$ film were removed (etching rate of Poly-Si was 600 nm/min or higher, and the etching rate of $SiO_2$ was 200 nm/min or higher), and no change was observed in the appearance of the Si substrate, and the weight change rate was −0.17%.

Comparative Example 1

A wafer sample similar to Example 1 was placed inside the processing vessel of the heatable vacuum device, and $ClF_3$ was fed from the capturing vessel through the mass flow controller at a flow rate of 100 sccm, and $N_2$ was simultaneously fed as an inert gas to provide dilution at a flow rate of 400 sccm to adjust the $ClF_3$ concentration to 20 vol %. The wafer sample was processed for 30 sec. by setting the temperature to 400° C. and the pressure to 100 Torr. As a result, all the Poly-Si film and the $SiO_2$ film were removed (etching rate of Poly-Si was 600 nm/min or higher, and the etching rate of $SiO_2$ was 200 nm/min or higher), but the Si substrate was badly damaged, and the weight change rate was −2.40%.

Comparative Example 2

A wafer sample similar to Example 1 was placed inside the processing vessel of the heatable vacuum device, and $ClF_3$ was fed from the capturing vessel through the mass flow controller into the processing vessel at a flow rate of 200 sccm, and $N_2$ was simultaneously fed as an inert gas to provide dilution at a flow rate of 300 sccm to adjust the $ClF_3$ concentration to 40 vol %. The wafer sample was processed for 30 sec. at 400° C. and a pressure of 100 Torr. As a result, all the Poly-Si film and $SiO_2$ film were removed (etching rate of Poly-Si was 600 nm/min or higher, and the etching rate of $SiO_2$ was 200 nm/min or higher), but the Si substrate was badly damaged, and the weight change rate was −2.32%.

Comparative Example 3

A wafer sample similar to Example 1 was placed inside the processing vessel of the heatable vacuum device, and $ClF_3$ was fed from the capturing vessel through the mass flow controller at a flow rate of 50 sccm, and $N_2$ was simultaneously fed as an inert gas to provide dilution at a flow rate of 450 sccm to adjust the $ClF_3$ concentration to 10 vol %. The wafer sample was processed for 30 sec. at 400° C. and a pressure of 100 Torr. As a result, all the Poly-Si film and $SiO_2$ film were removed (etching rate of Poly-Si was 600 nm/min or higher, and the etching rate of $SiO_2$ was 200 nm/min or higher), but the Si substrate was badly damaged, and the weight change rate was −1.69%.

Comparative Example 4

A wafer sample similar to Example 1 was placed inside the processing vessel of the heatable vacuum device, and $ClF_3$ was fed from the capturing vessel through the mass flow controller at a flow rate of 400 sccm, and $N_2$ was simultaneously fed as an inert gas to provide dilution at a flow rate of 100 sccm to adjust the $ClF_3$ concentration to 80 vol %. The wafer sample was processed for 30 sec. at 400° C. As a result, all the Poly-Si film and $SiO_2$ film were removed (etching rate of Poly-Si was 600 nm/min or higher, and the etching rate of $SiO_2$ was 200 nm/min or higher), but the Si substrate was badly damaged, and the weight change rate was −5.51%.

Comparative Example 5

A Si wafer sample and processing device similar to Example 1 were used, and ClF was applied as the monofluorohalogen compound. ClF was fed from the capturing vessel through the mass flow controller at a flow rate of 100 sccm, and $N_2$ was simultaneously fed as an inert gas to provide dilution at a flow rate of 400 sccm to adjust the ClF concentration to 20 vol %. The wafer sample was processed for 30 sec. by adjusting the device interior to a temperature of 300° C. and a pressure of 100 Torr. As a result, Poly-Si was etched at an etching rate 374 nm/min, and a Poly-Si film averaging 114 nm remained.

Example 5

Used as test specimens were materials commonly applied to the interior of the processing vessel of the thermal CVD device: graphite (C), alumina ($Al_2O_3$), aluminum nitride (AlN). Their respective dimensions were 20×20×5 mm (3.6619 g), 20×20×2 mm (3.2529 g), and 20×20×2 mm (2.6453 g). Each test specimen was sealed in a reactor made of Ni, φ2B, and having 1 m of length, and ClF was applied as a monofluorohalogen compound to assess the weight change rate from an unprocessed state, and to perform a composition analysis by SEM-EDX. The test was performed by achieving a vacuum state inside the reactor in which the test specimen was sealed using a vacuum pump, and ClF was fed without being mixed with inert gas from the capturing vessel through the mass flow controller until a normal pressure (0.1 MPaG) was achieved, and to expose the test specimen at a condition of 600° C. for 24 hours. As a result, the following weight change rates of the test specimens were obtained: graphite (−0.40%), alumina (+0.03%), aluminum nitride (+0.05%).

Comparative Example 6

An experimental operation similar to Example 5 was performed using $ClF_3$ similar to Comparative Example 1. Test specimens of graphite, alumina, and aluminum nitride were used, the respective dimensions being 20×20×5 mm (3.6577 g), 20×20×2 mm (3.2476 g), and 20×20×2 mm (2.7163 g). The interior of the reactor that encapsulates the test specimen was made vacuum by a vacuum pump, and $ClF_3$ was fed without being mixed with inert gas from the capturing vessel through the mass flow controller until a normal pressure (0.1 MPaG) was achieved, and the test specimen was exposed at a condition of 600° C. for 24 hours. As a result, the following weight change rates of the test specimens were obtained: graphite (−1.02%), alumina (+0.45%), aluminum nitride (+0.66%).

Tables 1, 2 and 3 shown below show results of an analysis using SEM-EDX of the composition of an unprocessed sample, and samples processed in Example 5 and Comparative Example 6. When comparing the results of Example 5 and Comparative Example 6, Comparative Example 6 exhibits a weight change rate and fluorine atom content of the sample surface which are larger than those of Example 5. This result indicates that a use of a halogen fluoride compound represented by XF (wherein X is Cl, Br or I) keeps the damage of the material of the device interior small in the actual cleaning operation of the semiconductor device.

TABLE 1

| mass concentration [wt %] | C | O | F |
|---|---|---|---|
| blank | 98.9 | 1.1 | — |
| Example 5 | 98.4 | 1.1 | 0.5 |
| Comp. Example 6 | 97.6 | 1.0 | 1.4 |

TABLE 2

| mass concentration [wt %] | Al | O | F |
|---|---|---|---|
| blank | 46.3 | 53.7 | — |
| Example 5 | 41.6 | 42.1 | 16.3 |
| Comp. Example 6 | 33.2 | 25.0 | 41.8 |

TABLE 3

| mass concentration [wt %] | Al | N | O | F |
|---|---|---|---|---|
| blank | 32.2 | 54.7 | 13.1 | — |
| Example 5 | 40.7 | 45.3 | 0.7 | 13.3 |
| Comp. Example 6 | 44.9 | 19.3 | 0.0 | 35.9 |

The invention claimed is:

1. A cleaning method that includes a process of removing an unwanted Si-containing deposit directly attached to a surface of an interior of a processing room or processing vessel without damaging the interior of the processing room or processing vessel after performing a processing operation in the interior of the processing room or processing vessel used for manufacturing a semiconductor device, the method comprising supplying, in that process of removing a Si-containing deposit without using a plasma, monofluorohalogen gas into the processing room or processing vessel to remove the Si-containing deposit, wherein:

the monofluorohalogen gas is ClF;

a material of the surface of the interior of the processing room or processing vessel consists of at least one selected from the group consisting of graphite (C), alumina ($Al_2O_3$) and aluminum nitride (AlN);

the processing room or processing vessel has a temperature of 400° C. to 600° C. when the monofluorohalogen gas is supplied into the processing room or processing vessel; and the unwanted Si-containing deposit includes at least one of silicon dioxide ($SiO_2$), silicon nitride (SiN), silicon carbide (SiC), polycrystalline silicon (Poly-Si), single crystal silicon, amorphous silicon (a-Si), silicon oxynitride (SiON), silicon carbonitride (SiCN), and silicon oxycarbonitride (SiOCN).

2. The method according to claim 1, wherein the ClF is diluted to an ClF concentration of 20 to 90 vol % against 100 vol % of the total amount of ClF and inert gas.

3. The method according to claim 1, wherein the unwanted Si-containing deposit includes at least one of silicon dioxide ($SiO_2$) and polycrystalline silicon (Poly-Si), and wherein the etching rate of Poly-Si is 600 nm/min or higher, and the etching rate of $SiO_2$ is 200 nm/min or higher.

4. The method according to claim 3, wherein the material of the surface of the interior of the processing room or processing vessel consists of graphite (C).

5. The method according to claim 3, wherein the material of the surface of the interior of the processing room or processing vessel consists of alumina ($Al_2O_3$).

6. The method according to claim 3, wherein the material of the surface of the interior of the processing room or processing vessel consists of aluminum nitride (AlN).

* * * * *